US005847407A

United States Patent [19]

Lucero et al.

[11] Patent Number: 5,847,407

[45] Date of Patent: Dec. 8, 1998

[54] CHARGE DISSIPATION FIELD EMISSION DEVICE

[75] Inventors: Rodolfo Lucero, Scottsdale; Robert T. Smith, Tempe; Lawrence N. Dworsky, Scottsdale, all of Ariz.

[73] Assignee: Motorola Inc., Schaumburg, Ill.

[21] Appl. No.: 794,559

[22] Filed: Feb. 3, 1997

[51] Int. Cl.[6] .............................. H01L 29/06; H01L 29/12

[52] U.S. Cl. ................................ 257/10; 257/11; 313/306; 313/309; 313/310; 313/313

[58] Field of Search ......................... 257/10, 11; 313/309, 313/310, 313, 306

[56] References Cited

U.S. PATENT DOCUMENTS

| | | | |
|---|---|---|---|
| 5,063,323 | 11/1991 | Longo et al. | 313/310 X |
| 5,163,328 | 11/1992 | Holland et al. | 313/310 X |
| 5,374,868 | 12/1994 | Tjaden et al. | 313/310 |
| 5,559,389 | 9/1996 | Spindt et al. | 313/310 |
| 5,569,975 | 10/1996 | Taylor et al. | 313/310 |
| 5,635,791 | 6/1997 | Vickers | 313/310 X |
| 5,693,235 | 12/1997 | Liu et al. | 313/310 X |
| 5,698,942 | 12/1997 | Greene et al. | 313/310 X |

FOREIGN PATENT DOCUMENTS

| | | | |
|---|---|---|---|
| 4315731 A1 | 11/1993 | Germany | 257/99 |

*Primary Examiner*—William Mintel
*Attorney, Agent, or Firm*—Jasper W. Dockrey

[57] ABSTRACT

A charge dissipation field emission device (200, 300, 400) includes a supporting substrate (210, 310, 410), a cathode (215, 315, 415) formed thereon, a dielectric layer (240, 340, 440) formed on the cathode (215, 315, 415) and having emitter wells (260, 360, 460) and a charge dissipation well (252, 352, 452, 453) exposing a charge-collecting surface (248, 348, 448, 449), for bleeding off gaseous positive charge generated during the operation of the charge dissipation field emission device (200, 300, 400), an electron emitter (270, 370, 470) formed in each of the emitter wells (260, 360, 460), and an anode (280, 380, 480) spaced from the dielectric layer (240, 340, 440) for collecting electrons emitted by the electron emitters (270, 370, 470).

10 Claims, 2 Drawing Sheets

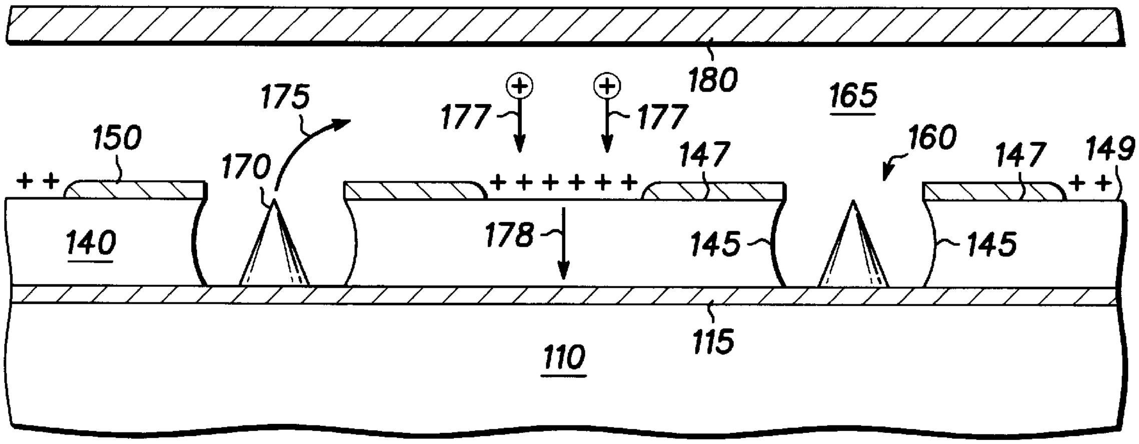
FIG. 1 100 - PRIOR ART -
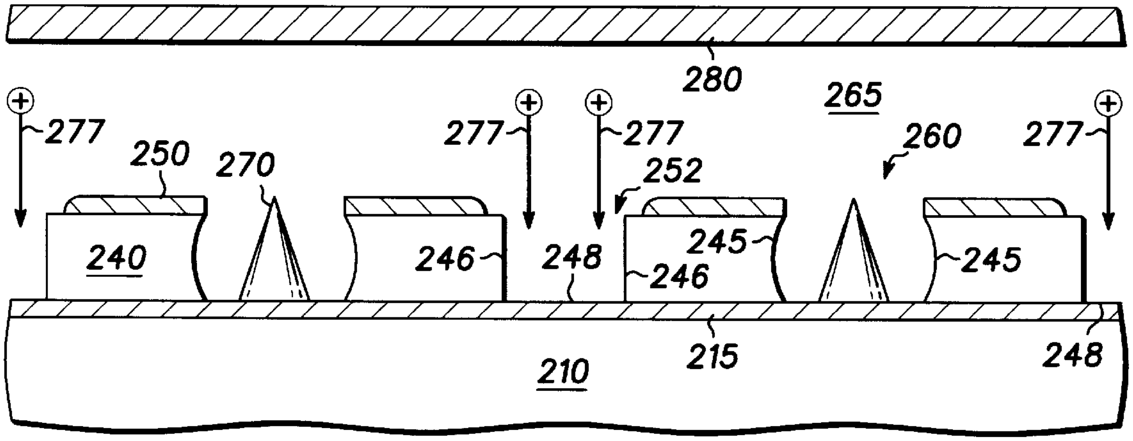
FIG. 2 200
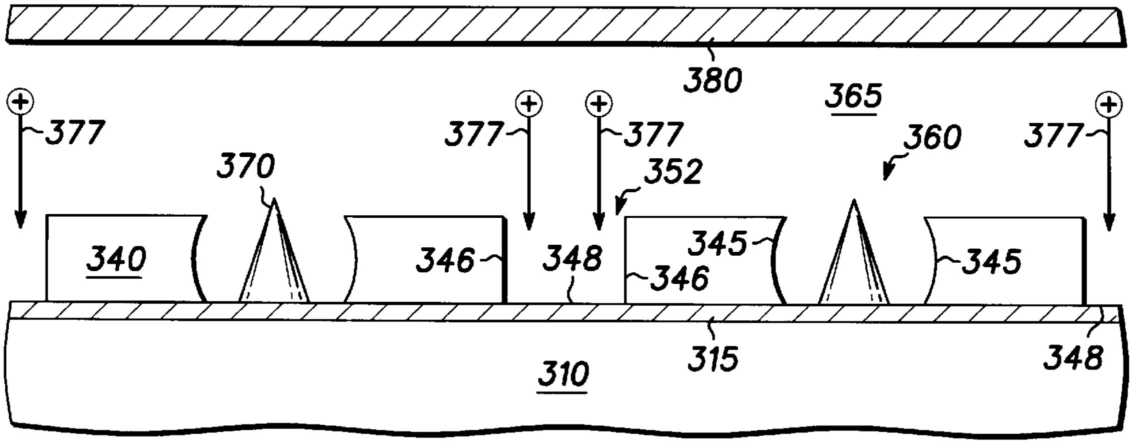
FIG. 3 300

CHARGE DISSIPATION FIELD EMISSION DEVICE

FIELD OF THE INVENTION

The present invention pertains to the field of field emission devices and, more particularly, to the cathode structure of a field emission device.

BACKGROUND OF THE INVENTION

Field emission devices and addressable matrices of field emission devices are known in the art. Selectively addressable matrices of field emission devices are used in, for example, field emission displays. Illustrated in FIG. 1 is a prior art field emission device (FED) 100 having a triode configuration. FED 100 includes a plurality of gate extraction electrodes 150 which are spaced from a cathode 115 by a dielectric layer 140. Cathode 115 includes a layer of a conductive material, such as molybdenum, which is deposited on a supporting substrate 110. Dielectric layer 140, made from a dielectric material, such as silicon dioxide, electrically isolates gate extraction electrodes 150 from cathode 115. Spaced from gate electrodes 150 is an anode 180, which is made from a conductive material, thereby defining an interspace region 165. Interspace region 165 is typically evacuated to a pressure below $10^{-6}$ Torr. Dielectric layer 140 has vertical surfaces 145 which define emitter wells 160. A plurality of electron emitters 170 are disposed, one each, within emitter wells 160 and may include Spindt tips. Dielectric layer 140 also includes a major surface having covered portions 147 and exposed portions 149. Gate extraction electrodes 150 are disposed on covered portions 147. Exposed portions 149 of the major surface of dielectric layer 140 are exposed to interspace region 165.

During the operation of FED 100, and as is typical of triode operation in general, suitable voltages are applied to gate extraction electrodes 150, cathode 115, and anode 180 for selectively extracting electrons from electron emitters 170 and causing them to be directed toward anode 180. A typical voltage configuration includes an anode voltage within the range of 100–10,000 volts; a gate extraction electrode voltage within a range of 10–100 volts; and a cathode potential below about 10 volts, typically at electrical ground. Emitted electrons strike anode 180, liberating gaseous species therefrom. Along their trajectories from electron emitters 170 to anode 180, emitted electrons also strike gaseous species, some of which originate from anode 180, present in interspace region 165. In this manner, cationic species are created within interspace region 165, as indicated by encircled "+" symbols in FIG. 1.

When FED 100 is incorporated into in a field emission display, anode 180 has deposited thereon a cathodoluminescent material. Upon receipt of electrons, the cathodoluminescent material emits light. Upon excitation, common cathodoluminescent materials tend to liberate substantial amounts of gaseous species, which are also vulnerable to bombardment by electrons to form cations. Cationic species within interspace region 165 are repelled from the high positive potential of anode 180, as indicated by a pair of arrows 177 in FIG. 1, and are caused to strike gate extraction electrodes 150 and exposed portions 149 of the major surface of dielectric layer 140. Those striking gate extraction electrodes 150 are bled off as gate current; those striking exposed portions 149 of the major surface of dielectric layer 140 are retained therein, resulting in a build up of positive potential, as indicated by "+" symbols in FIG. 1.

This build up of positive potential at exposed portions 149 continues until either dielectric layer 140 breaks down or until the positive potential is high enough to deflect (indicated by an arrow 175 in FIG. 1) electrons toward the major surface of dielectric layer 140, causing them to be received by exposed portions 149, and thereby neutralizing the surface charge. In the former instance, the breakdown of dielectric layer 140 is due to the realization thereover of the breakdown potential of the dielectric material, which is typically in the range of 300–1000 volts. The breakdown of dielectric layer 140 often results in initiation of an arc from anode 180 and catastrophic current (indicated by an arrow 178 in FIG. 1) between cathode 115 and exposed portions 149, destroying dielectric layer 140 and cathode 115 and thereby rendering FED 100 inoperable. In the latter instance, the charge buildup/neutralization cycle is subsequently repeated, leading to a de-focus condition for the electrons emitted from emitters 170.

In the development of field emission devices it has become desirable to minimize the amount of area overlap between gate extraction electrodes 150 and cathode 115 in order to lower power requirements due to inter-electrode capacitances. The reduction in area of gate extraction electrodes 150 has simultaneously increased the area of exposed portions 149 of the major surface of dielectric layer 140. This has resulted in exacerbation of dielectric charging problems and the concomitant loss of control or failure of the devices, as described in detail above.

Prior art electron tubes, such as cathode ray tubes used in televisions, have solved arcing problems due to charging of dielectric surfaces by coating otherwise exposed dielectric surfaces with a thin film of a conductive material, such as tin oxide. This technique is ineffective for solving the analogous charging problem in FED 100 because coating exposed portions 149 of dielectric layer 140 with a material such as tin oxide would cause shorting between gate extraction electrodes 150, effectively ruining the addressability of electron emitters 170. This addressability is crucial for the use of FED 100 in applications such as field emission displays.

Thus, there exists a need for a field emission device that does not fail from the accumulation of charge at the major exposed dielectric surfaces within the device.

BRIEF DESCRIPTION OF THE DRAWINGS

Referring to the drawings:

FIG. 1 is a cross-sectional view of a prior art field emission device;

FIG. 2 is a cross-sectional view of an embodiment of a charge dissipation field emission device, in accordance with the present invention;

FIG. 3 is a cross-sectional view of another embodiment of a charge dissipation field emission device, in accordance with the present invention;

DESCRIPTION OF THE PREFERRED EMBODIMENT

Figure 4:
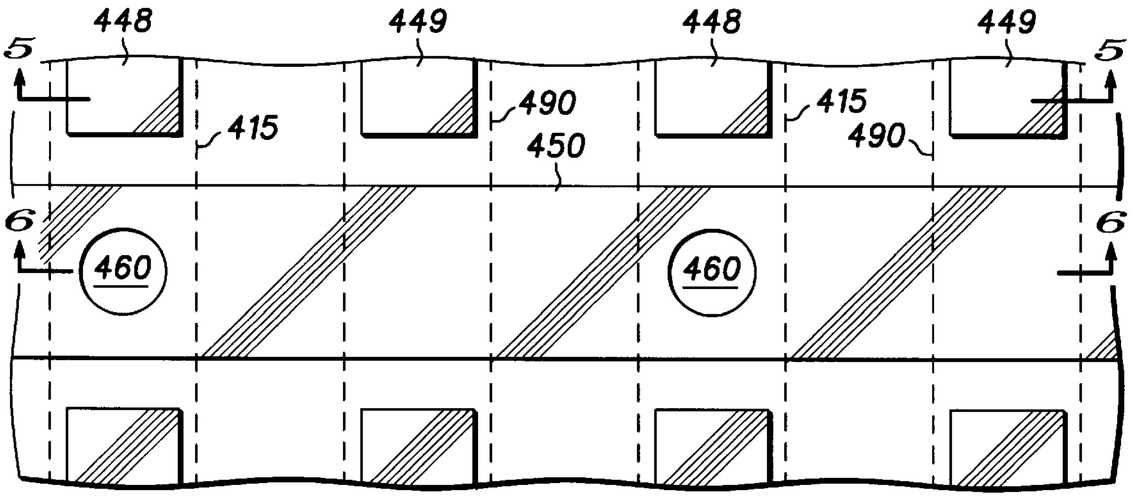
FIG. 4 is a top plan view of a schematic representation of another embodiment of a charge dissipation field emission device, in accordance with the present invention.

Referring now to FIG. 2, there is depicted a cross-sectional view of a charge dissipation field emission device 200, in accordance with the present invention. Charge dissipation field emission device 200 includes a supporting substrate 210, which may be made from glass, such as borosilicate glass, or silicon. Upon supporting substrate 210, is formed a cathode 215. In this particular embodiment, cathode 215 includes a layer of conductive material, such as molybdenum or aluminum. In general, cathode 215 includes a metal or other convenient conductive material. Charge dissipation field emission device 200 further includes a dielectric layer 240, which is formed on cathode 215. If cathode 215 is patterned, portions of dielectric layer 240 may also be disposed on supporting substrate 210 or any additional layers formed thereon. Dielectric layer 240 has a plurality of surfaces 245 which define a plurality of emitter wells 260. An electron emitter 270 is formed within each of emitter wells 260 and is operably coupled to cathode 215. In the illustrated embodiment, electron emitter 270 is formed on cathode 215 and includes a Spindt tip field emitter.

In another embodiment of the invention, a ballast resistor, made from a resistive material, such as amorphous silicon, extends from cathode 215 to electron emitter 270 to provide an electrical connection therebetween. Dielectric layer 240 further includes a plurality of surfaces 246. Cathode 215 is exposed at a plurality of charge-collecting surfaces 248. Surfaces 246 of dielectric layer 240 and charge-collecting surfaces 248 of cathode 215 define a plurality of charge dissipation wells 252. Charge dissipation wells 252 may be formed by depositing a layer of dielectric material on cathode 215 and then selectively etching the dielectric material to expose an underlying portion of cathode 215. In general, it is desired to expose an underlying metal which is suitable for receiving and bleeding off gaseous, charged species within charge dissipation field emission device 200. It is also desired to reduce the amount of dielectric dielectric material present within charge dissipation field emission device 200, thereby reducing the area of charged dielectric surfaces during operation.

Removal of charged species and reduction of the area of charged dielectric surfaces result in important advantages. These advantages include preserving the integrity of operating structures, such as electron emitters 270, and improving control over electron emission. Charge dissipation wells 252 may be disposed within the active region of charge dissipation field emission device 200 defined by an array of electron emitters 270. Charge dissipation wells 252 may also be disposed at the periphery of charge dissipation field emission device 200, outside the active region. A plurality of gate extraction electrodes 250 are formed on dielectric layer 240 and are spaced from electron emitters 270 and from cathode 215.

The configuration of gate extraction electrodes 250, electron emitters 270, and cathode 215 is designed to achieve electron emission from electron emitters 270 upon application of predetermined potentials at cathode 215 and gate extraction electrodes 250. Dielectric layer 240 provides sufficient dielectric material to define emitter wells 260 and to support gate extraction electrodes 250 so that they are electrically separated from cathode 215. Charge dissipation field emission device 200 further includes an anode 280, which is spaced from gate extraction electrodes 250, to define an interspace region 265 therebetween, and includes a conductive material for receiving electrons.

The operation of charge dissipation field emission device 200 includes applying the appropriate potentials, via grounded voltage sources (not shown) which are external to charge dissipation field emission device 200, to cathode 215, gate extraction electrodes 250, and anode 280 to produce electron emission from electron emitters 270 and to direct the emitted electrons toward anode 280 at an appropriate acceleration. During the operation of charge dissipation field emission device 200, cationic gaseous species are produced within interspace region 265 and are attracted toward cathode 215, which is held at a lower potential than anode 280. A cationic current 277, which is indicated by an arrow in FIG. 2, includes these undesirable charged species. A portion of cationic current 277 is received by charge-collecting surfaces 248 of cathode 215 and bled off to a grounded potential source (not shown). Another portion of cationic current 277 is received by gate extraction electrodes 250 and bled off to a grounded potential source (not shown). The removed charged species are no longer available to charge dielectric surfaces or impinge upon and cause damage to the operating elements, such as electron emitters 270, of charge dissipation field emission device 200.

The fabrication of charge dissipation field emission device 200 includes a patterning step wherein a layer of dielectric material is patterned to form charge dissipation wells 252. First, cathode 215 is formed by depositing a conductive material, such as molybdenum or aluminum, on supporting substrate 210 by a convenient process, such as sputtering or plasma-enhanced chemical vapor deposition (PECVD). Cathode 215 may thereafter be patterned to form addressable columns.

A ballast resistor may be included in cathode 215. The ballast resistor provides an electrical connection between the conductive material of cathode 215 and electron emitters 270. The ballast resistor includes a layer of resistive material, such as amorphous silicon, which is deposited on supporting substrate 210 by a convenient process, such as plasma-enhanced chemical vapor deposition (PECVD). The layer of resistive material is thereafter patterned so that the resistor extends from the conductive material of cathode 215 to electron emitters 270.

Next, a dielectric, such as silicon dioxide, is deposited on cathode 215 by known deposition methods. Gate extraction electrodes 250 are formed by a convenient deposition technique on the dielectric layer and are made from a conductor, such as molybdenum. The dielectric layer is selectively etched to form charge dissipation wells 252 in registration with portions of cathode 215 so that the dielectric material above charge-collecting surfaces 248 is removed. Thereafter, charge dissipation wells 252 are covered with a mask of photoresist to prevent the deposition therein of the material comprising electron emitters 270. The dielectric layer is again patterned and selectively etched to form emitter wells 260. Then, electron emitters 270 are formed within emitter wells 260 by standard tip fabrication techniques, known to one skilled in the art. Thereafter, the photoresist is removed from charge dissipation wells 252.

It is within the scope of the invention that electron emitters other than Spindt tips can be used, including, for example, carbon-based surface emitters, such as diamond-like carbon layers. Additionally, a field emission device in accordance with the present invention can include electrode configurations other than a triode, such as diode and tetrode.

Referring now to FIG. 3, there is depicted a cross-sectional view of a charge dissipation field emission device 300, in accordance with the present invention. Charge dissipation field emission device 300 includes elements of charge dissipation field emission device 200 (FIG. 2), which are similarly referenced, beginning with a “3”. However, charge dissipation field emission device 300 does not include a gate extraction electrode. Charge dissipation field emission device 300 may be fabricated in a manner similar to that described with reference to FIG. 2. However, the step of forming gate extraction electrodes is omitted.

The operation of charge dissipation field emission device 300 includes applying the appropriate potentials, via grounded voltage sources (not shown) which are external to charge dissipation field emission device 300, to a cathode 315 and an anode 380 to produce electron emission from a plurality of electron emitters 370.

Figure 5:
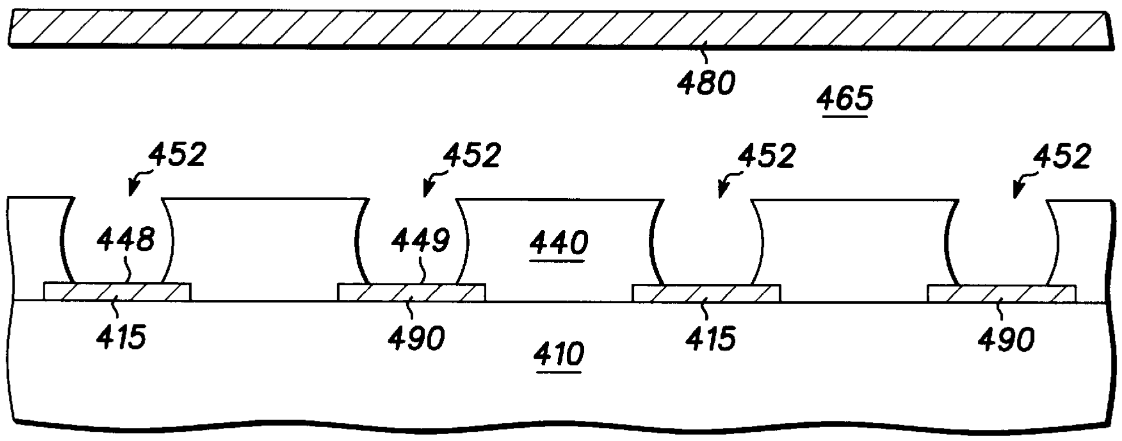
FIG. 5 is a sectional view of the structure of FIG. 4, taken along the section line 5—5.
Figure 6:
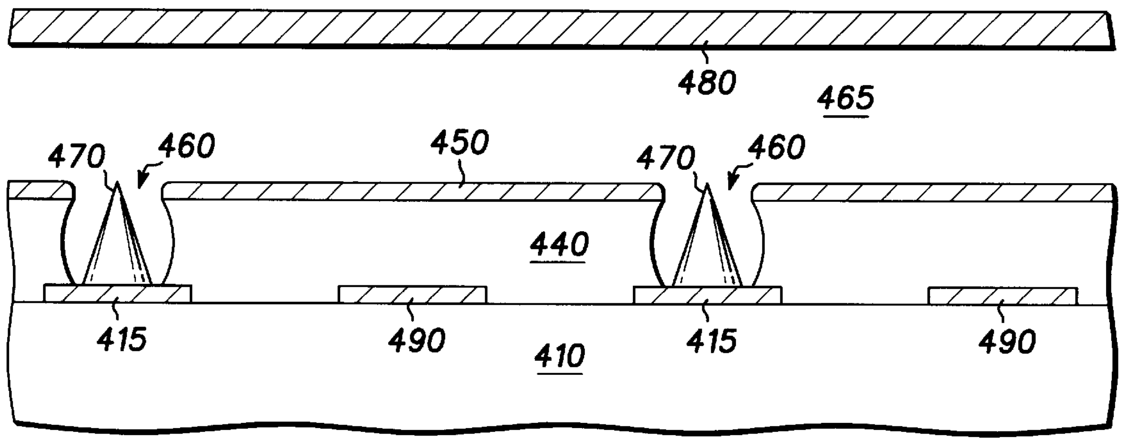
FIG. 6 is a sectional view of the structure of FIG. 4, taken along the section line 6—6.

Referring now to FIGS. 4–6, there are depicted views of a schematic representation of a charge dissipation field emission device 400, in accordance with the present invention. Schematically illustrated in FIG. 4 is a top plan view of charge dissipation field emission device 400; shown in FIGS. 5 and 6 are sectional views taken along the section lines 5—5 and 6—6, respectively, in FIG. 4. Charge dissipation field emission device 400 includes elements of charge dissipation field emission 200 (FIG. 2), which are similarly referenced, beginning with a "4". Charge dissipation field emission device 400 includes a plurality of spaced apart cathodes 415 formed on a supporting substrate 410. Cathodes 415 are made from a conductive material, such as molybdenum or aluminum. In general, cathodes 415 are made from a metal or other convenient conductive material and are electrically isolated from one another to provide selective addressability of a plurality of electron emitters 470. A charge dissipation layer 490 is formed on supporting substrate 410 between adjacent ones of cathodes 415. In this particular embodiment, charge dissipation layer 490 is electrically isolated from cathodes 415. Charge dissipation layer 490 is made from a conductive material and is electrically connected to a grounded electrical contact (not shown) external the field emission device. Charge dissipation layer 490 includes a charge-collecting surface 449, which receives charged gaseous species during the operation of charge dissipation field emission device 400. The charge is thereafter bled off by charge dissipation layer 490 to the grounded electrical contact.

The fabrication of charge dissipation field emission device 400 includes the steps of forming charge dissipation layer 490 on supporting substrate 410 and forming a charge dissipation well 453 in a dielectric layer 440 for exposing charge-collecting surface 449 of charge dissipation layer 490. As indicated in FIGS. 4 and 5, a charge dissipation well 452 may also be formed in dielectric layer 440 to expose a charge-collecting surface 448 of cathodes 415, in a manner similar to that described with reference to FIG. 2. Cathodes 415 are patterned on supporting substrate 410. Charge dissipation layer 490 is provided between cathodes 415 by a convenient deposition technique, such as a masked deposition of the conductive material comprising charge dissipation layer 490. Charge dissipation layer 490 may be made from a conductor, such as aluminum, or from some other more resistive material, such amorphous silicon. Thereafter, a dielectric, such as silicon dioxide, is deposited on cathodes 415 and charge dissipation layer 490 by known deposition methods. A gate extraction electrode 450 is formed on the dielectric layer. Gate extraction electrode 450 is made from a conductor, such as molybdenum, which is deposited by a convenient deposition method. Thereafter, the dielectric layer is selectively etched to form charge dissipation wells 453 and expose charge-collecting surfaces 449 of charge dissipation layer 490. The dielectric layer may also be selectively etched to form charge dissipation wells 452 and expose charge-collecting surfaces 448 of cathodes 415. Charge dissipation wells 453, 452 are covered with a mask of photoresist to prevent the deposition therein of the material comprising electron emitters 470.

Next, the dielectric layer is selectively etched to form a plurality of emitter wells 460. One of electron emitters 470 is formed within each of emitter wells 460 by standard Spindt tip fabrication techniques, known to one skilled in the art. Finally, the photoresist is removed from charge dissipation wells 453, 452.

In yet a further embodiment of the present invention, the charge dissipation layer is electrically connected to the cathode so that the charge that is received by the charge dissipation layer is bled into, and conducted away by, the cathode. In the present embodiment, shorting between cathodes connected by the charge dissipation layer is prevented by imparting to the charge dissipation layer a relatively high sheet resistance. Also, in the present embodiment, the charge dissipation layer has a sheet resistance within a range of $10^9$–$10^{12}$ Ohms/square. It is preferably made from undoped amorphous silicon. Any material providing a sheet resistance within the above range of sheet resistances and having suitable film characteristics may be employed. Suitable film characteristics include adequate adhesion to the supporting substrate. The sheet resistance is predetermined to effect conduction of the current of positively charged species which impinge upon charge dissipation layer 490, thereby reducing the accumulation of positive surface charge during the operation of the device. The ionic current produced within the interspace region, as a percentage of emitted electrons, is believed to be less than or equal to about 0.1%. In a field emission display, for example, the cationic return current is believed to be about 10 picoamps. Because the cationic current is so small, the sheet resistance of the charge dissipation layer can be made high enough to prevent shorting, and excessive power loss, between the cathodes, and simultaneously be adequate to conduct/bleed-off impinging charges. In this particular embodiment, the thickness of the charge dissipation layer is within a range of 100–5000 angstroms.

A charge dissipation field emission device has been disclosed, which reduces the amount of dielectric surface within the device, and which provides structure for the conduction of undesirable positive charge generated during the operation of the device. These features reduce the probability of dielectric breakdown and provide control over electron trajectories.

We claim:

1. A charge dissipation field emission device comprising:

a supporting substrate having a major surface;

a cathode disposed on the major surface of the supporting substrate and having a charge-collecting surface;

a dielectric layer disposed on the cathode, the dielectric layer defining an emitter well, the dielectric layer and the charge-collecting surface of the cathode defining a charge dissipation well;

an electron emitter disposed in the emitter well; and an anode spaced from the dielectric layer to define an interspace region therebetween, the charge dissipation well being in communication with the interspace region.

2. A charge dissipation field emission device comprising:

a supporting substrate having a major surface;

a cathode disposed on the major surface of the supporting substrate and having a charge-collecting surface;

a dielectric layer disposed on the cathode, the dielectric layer defining an emitter well, the dielectric layer and the charge-collecting surface of the cathode defining a charge dissipation well;

an electron emitter disposed in the emitter well;

a gate extraction electrode electrically isolated from and proximate to the cathode and the electron emitter for effecting electron emission therefrom; and an anode spaced from the gate extraction electrode to define an interspace region therebetween, the charge dissipation well being in communication with the interspace region.

3. A charge dissipation field emission device comprising:

a supporting substrate having a major surface;

a cathode being disposed on the major surface of the supporting substrate and having a charge-collecting surface;

a dielectric layer having a major surface and being disposed on the cathode, the dielectric layer defining an emitter well, the dielectric layer and the charge-collecting surface of the cathode defining a charge dissipation well;

an electron emitter disposed in the emitter well;

a gate extraction electrode disposed on the major surface of the dielectric layer and proximate to the emitter well; and an anode spaced from the gate extraction electrode to define an interspace region therebetween, the charge dissipation well being in communication with the interspace region.

4. A charge dissipation field emission device comprising:

a supporting substrate having a major surface;

a cathode disposed on the major surface of the supporting substrate;

a charge dissipation layer disposed on the major surface of the supporting substrate adjacent the cathode and having a charge-collecting surface;

a dielectric layer disposed on the cathode and the charge dissipation layer, the dielectric layer defining an emitter well, the charge-collecting surface of the charge dissipation layer and the dielectric layer defining a charge dissipation well;

an electron emitter disposed in the emitter well; and an anode spaced from the dielectric layer to define an interspace region therebetween, the charge dissipation well being in communication with the interspace region.

5. The charge dissipation field emission device as claimed in claim 4, wherein the charge dissipation layer is electrically isolated from the cathode.

6. The charge dissipation field emission device as claimed in claim 4, wherein the charge dissipation layer is electrically coupled to the cathode.

7. The charge dissipation field emission device as claimed in claim 6, wherein the charge dissipation layer is made from amorphous silicon.

8. The charge dissipation field emission device as claimed in claim 6, wherein the charge dissipation layer has a sheet resistance within a range of $10^9$–$10^{12}$ Ohms/square.

9. A method for reducing charging within a field emission device having a cathode, and a dielectric layer disposed thereon, an anode, and an interspace region therebetween, the method comprising the step of providing communication between a portion of the cathode and the interspace region by forming a charge dissipation well in the dielectric layer in registration with the portion of the cathode.

10. A method for reducing charging within a field emission device comprising the steps of:

providing a supporting substrate having a major surface;

forming on the major surface of the supporting substrate a cathode having a charge-collecting surface;

forming a dielectric layer on the cathode;

forming in the dielectric layer an emitter well;

forming in the dielectric layer a charge dissipation well in registration with the charge-collecting surface of the cathode;

providing an electron emitter in the emitter well; and providing an anode spaced from the dielectric layer to define an interspace region therebetween so that the charge dissipation well is in communication with the interspace region.

* * * * *